United States Patent [19]

Linke

[11] Patent Number: 5,063,344
[45] Date of Patent: Nov. 5, 1991

[54] MODE SELECTABLE INTERFACE CIRCUIT FOR AN AIR CORE GAGE CONTROLLER

[75] Inventor: Scott L. Linke, Flora, Ind.

[73] Assignee: Delco Electronics Corporation, Kokomo, Ind.

[21] Appl. No.: 488,567

[22] Filed: Mar. 5, 1990

[51] Int. Cl.[5] .................... G01R 15/08; H02K 11/00
[52] U.S. Cl. .................................. 324/115; 324/120; 324/144; 310/68 D
[58] Field of Search .................. 324/144, 140 D, 115, 324/130, 131, 120, 128, 78 D; 310/66, 68 R, 68 A, 68 D

[56] References Cited

U.S. PATENT DOCUMENTS

| | | | |
|---|---|---|---|
| 4,051,434 | 9/1977 | Sweet | 324/78 D |
| 4,167,699 | 9/1979 | Baker | 324/166 X |
| 4,230,984 | 10/1980 | Taylor | 324/115 |
| 4,810,953 | 3/1989 | Huynh | 324/120 |
| 4,827,209 | 5/1989 | Tanaka et al. | 324/115 X |
| 4,908,572 | 3/1990 | Sakai et al. | 324/173 |
| 4,939,675 | 7/1990 | Luitje | 324/166 X |
| 4,991,098 | 2/1991 | Dantzler | 324/166 X |

Primary Examiner—Kenneth A. Weider
Assistant Examiner—Warren S. Edmonds
Attorney, Agent, or Firm—Mark A. Navarre

[57] ABSTRACT

A single integrated circuit operable in either a single chip mode or a host dependent mode. The integrated circuit comprises mode select circuitry for selecting the single chip mode or the host dependent mode, data acquisition circuitry for acquiring signals pertaining to a parameter to be displayed, control circuitry including serial engine circuitry for computing a gage displacement value based on the signals acquired by the data acquisition circuitry and a memory register for storing a gage displacement command, serial circuitry effective when the single chip mode is selected to store the computer gage displacement value in the memory register, and when the host dependent mode is selected to store a remotely generated displacement value in the memory register, signal conversion circuitry for converting the gage displacement command stored in the memory register to air core gage assembly drive commands and providing the same on a serial communication channel, and output circuitry for driving the air core gage assembly in response to the commands received on the serial communication channel.

3 Claims, 4 Drawing Sheets

MODE SELECTABLE INTERFACE CIRCUIT FOR AN AIR CORE GAGE CONTROLLER

BACKGROUND OF THE INVENTION

The present invention relates to integrated chip (IC) air core gage controls and, more particularly, to a serial interface circuit apparatus for driving an air core gage from a serial data input derived from any source.

Air core gage controllers and control methods have a variety of applications, often in less than ideal environments. Some applications include automotive, aircraft and marine instrument panels, as well as industrial and medical instruments. Typically, an air core gage is used along with a pointer and dial assembly to display vehicle speed. The air core gage is driven by a signal from an electric speedometer circuit board.

In the basic operation of an air core gage, a sinusoidal signal is transmitted to the circuit assembly by a permanent magnet speed sensor. The sinusoidal signal is processed to provide the proper signals necessary to drive the air core gage mechanism. A conventional air core gage has a horizontal coil and a vertical coil. Current flowing through each of these coils causes a magnetic flux field to be induced. As the current through the coils varies, the induced flux field varies.

In a speedometer air core gage assembly application, the varying flux field causes a magnet and vehicle speed indicator assembly to rotate inside a cavity. By controlling the magnitude and direction of the current through each coil, a flux field can be established to control the resultant angle of rotation of the magnet and spindle assembly. With proper control of current magnitude and direction, accurate vehicle speed is indicated by the air core gage and dial assembly. To achieve proper control of the current flow, the speedometer circuitry utilizes the transmitted speed signal to determine the octant the air core gage should be operating within.

One type of speedometer system that utilizes an air core gage is a quartz electric speedometer. The quartz electric speedometer includes conventional dials, pointers and odometer wheels to indicate vehicle speed and mileage. Improved drive methods are used to drive these components in place of the standard drive system presently used with mechanical methods being operated with mechanical drive gear speedometer systems. To provide accurate vehicle information, the quartz electric speedometer utilizes a clock signal supplied by a quartz crystal along with integrated electronic circuitry to process a speed signal. The vehicle speed signal is provided by a transmission mounted permanent magnet speed sensor and is used to drive the air core gage mechanism and odometer stepper motor. This system eliminates the need for a flexible shaft speedometer cable used with the mechanical speedometer and provides more accurate and precise vehicle speed information to the driver.

Many vehicles manufactured today are provided with a two chip speedometer air core gage instrument system which includes a logic chip and a driver chip. The circuitry of one such logic chip is disclosed in U.S. Pat. No. 4,051,434 to Sweet, issued Sept. 27, 1977, and assigned to the assignee of the present invention. The circuitry disclosed in the Sweet patent consists of a bit serial computation engine which performs a Vehicle Speed Signal (VSS) frequency to miles per hour (MPH) calculation and generates the control signals needed by the driver chip.

Another alternative means for providing air core gage control of display systems involves microprocessor supervision. Microprocessor supervised systems are host dependent, meaning a microprocessor or similar host is needed to apply an input frequency to drive the air core gage controller. Current methods of microprocessor supervised air core gage control require the generation of pulse-width-modulation (PWM) signals instead of using an analog frequency conversion method. Due to limited chip resources, current methods of microprocessor air core gage control require a custom chip to generate signals. However, microprocessor supervision yields improved accuracy given the additional computational resources available. Additionally, host dependent systems are sometimes preferred when multiple air core gage applications exist, as in a system wherein the speedometer, tachometer and odometer each have a separate air core gage assembly which must be driven. When multiple hosts share data in a vehicle, a host dependent mode of operation may be preferred to save on wiring costs and to minimize connection problems that arise when a system is extensively wired.

Digital control requires digital-to-analog conversion of a calculated result into a drive voltage to be applied to the air core gage coils. Current methods for this conversion have been implemented with a 512 Hertz (Hz) pulse-width-modulated drive signal. However, at this low frequency, audible noise may be generated in the air core gage coils, thus mandating the use of a higher frequency, greater than 20 KHz, which would be above the audible range. Also, an air core driver chip is needed for each gage in the display, adding to the overall cost of such a system.

Hence, it would be desirable to provide a method and apparatus for air core gage control which would eliminate the need for additional custom chips and additional driver chips. It would also be desirable to provide a serial engine circuit which would allow two modes of operation to be accomplished, single chip and host dependent, even where the host dependent mode has multiple chips, each driving an air core gage assembly. Finally, it would be desirable to provide a method of air core gage drive control having host compatibility, thereby opening new avenues for advanced air core displays and integrated manufacturing environments for analog instrument panels.

SUMMARY OF THE INVENTION

The present invention provides an apparatus for integrating the logic chip and the driver chip of an air core gage instrument system onto a single die, thereby creating a single IC operable in both a single chip environment and a host dependent environment. The dual purpose IC of the present invention has the capability of operating in a single chip mode or a host dependent mode. Host compatibility is provided through a serial peripheral interface (SPI). The present invention has modified, for host interface integration, the existing two chip set used in such systems as the quartz speedometer system. The integration consists of combining the logic chip and the driver chip functions onto a single die, thereby providing a method of air core gage driver control having microprocessor compatibility.

the present invention discloses a serial interface circuit for driving an air core gage assembly, the circuit being capable of operating in a single chip environment or a host dependent environment. The serial interface circuit disclosed in the present invention includes both the logic circuitry and the driver circuitry on a single chip. The circuit comprises mode select circuitry for selecting the single chip mode or the host dependent mode, data acquisition circuitry for acquiring signals pertaining to a parameter to be displayed, control circuitry including serial engine circuitry for computing a gage displacement value based on the signals acquired by the data acquisition circuitry and a memory register for storing a gage displacement command, serial circuitry effective when the single chip mode is selected to store the computed gage displacement value in the memory register, and when the host dependent mode is selected to store a remotely generated displacement value in the memory register, signal conversion circuitry for converting the gage displacement command stored in the memory register to air core gage assembly drive commands and providing the same on a serial communication channel, and output circuitry for driving the air core gage assembly in response to the commands received on the serial communication channel.

In various embodiments of the present invention, the serial data input may be provided by the engine control module of a vehicle via a vehicle serial bus or by a host processor via a local serial bus. Additionally, the data acquisition means may be a state machine, wherein the state machine may be either a microcontroller IC or a custom IC.

A more complete understanding of the present invention may be had from the following detailed description which should be read in conjunction with the drawings.

DETAILED DESCRIPTION OF THE DRAWINGS

The present invention provides for a single integrated chip realization of the logic and driver circuitry needed to drive an air core gage assembly, wherein both the logic and driver circuitry are combined on a single die. In a single chip mode of operation, a combined logic/driver chip is used to drive a single air core gage assembly, such as for a speedometer. However, a host dependent mode is also available and is preferred for multiple air core gage assembly applications, as where a local serial bus has multiple chips, each driving a separate air core gage assembly, such as for a speedometer and a tachometer and an odometer. In the host dependent mode, the combined logic/driver chip of the present invention requires a microprocessor or other host to determine the angular displacement value for each air core gage.

Figure 1:
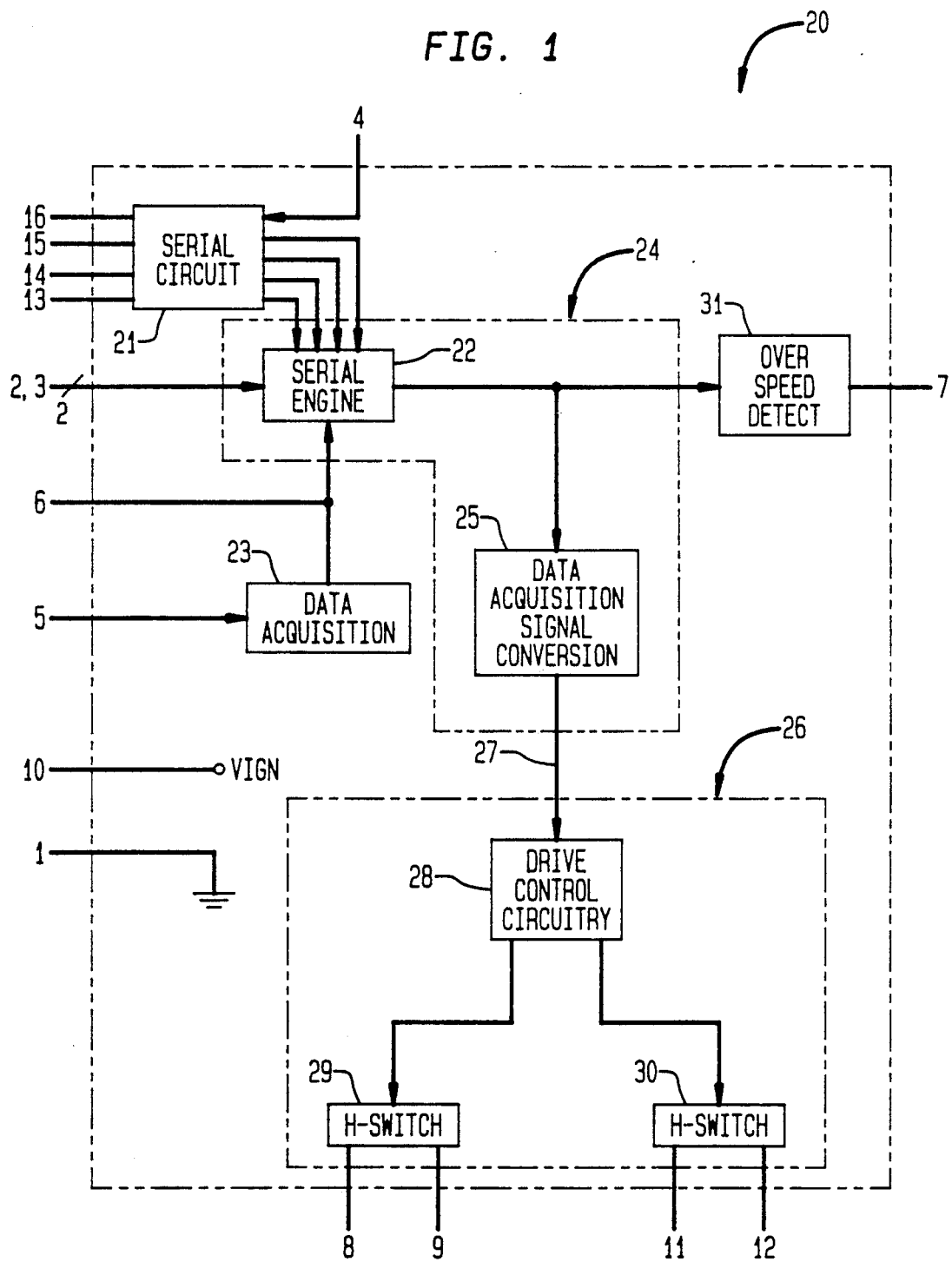
FIG. 1 is a block diagram of the single integrated chip realization of the present invention providing for two modes of operation, specifically a single chip mode and a host dependent mode.

Referring now to the drawings and initially to FIG. 1, in a preferred embodiment of the present invention a block diagram of a single chip realization of the present invention is generally designated 20. In the first mode of operation, the single chip mode, the serial engine 22 accepts an input frequency and scaling (gain) data from serial circuit 21 and calculates a value which represents the desired angular displacement for the given input frequency. The single chip 20 of the present invention has host capabilities in a second mode of operation, the host dependent mode, in which a microprocessor or other host determines the desired angular displacement value for the air core gage.

It will be recognized that the integrated chip 20 of FIG. 1 is an example of a preferred pin selection for the present invention for purposes of illustrating the single integrated chip realization of a speedometer logic IC and a speedometer driver IC of the present invention, and is not to be considered as limiting the invention. In the 16-pin integrated chip 20 of FIG. 1, a ground is assigned to pin 1. Pins 2 and 3 indicate inputs for either a crystal or an external oscillator. Pin 4 of the IC 20 may be used as a mode select means of operation for a serial engine or input in the present invention for selecting the desired mode and controlling the multiplex circuit of FIG. 2. Vehicle speed signal inputs and outputs are assigned to pins 5 and 6, respectively, wherein pin 5 inputs signals required by the selected mode to a data acquisition means. An output is available at pin 7 for Over Speed detection if required and an ignition voltage, VIGN, which is the power source for the IC 20, is assigned to pin 10. Pins 8, 9, 11 and 12 designate H-switch outputs, and pins 13 through 16 are input to a serial circuit 21 to provide a serial data input scaling (gain select) data to the serial engine 22. Scaling data expands or contracts the full-scale range of angular displacement on the air core gage for a determined range of input frequencies when operating in single chip mode.

In FIG. 1 of the present invention, the signal on pin 4 determines the mode in which the system will operate. A serial data interface and multiplex circuit 21 responds to the mode selection of pin 4 by switching between the single chip mode and the host dependent mode according to the selection made. The serial data interface and multiplex circuit 21 is a serial data input means which inputs the selected mode to a serial engine 22. A data acquisition circuit 23 accepts signals required for operation of the selected mode and provides these signals to the serial engine 22.

Figure 4:
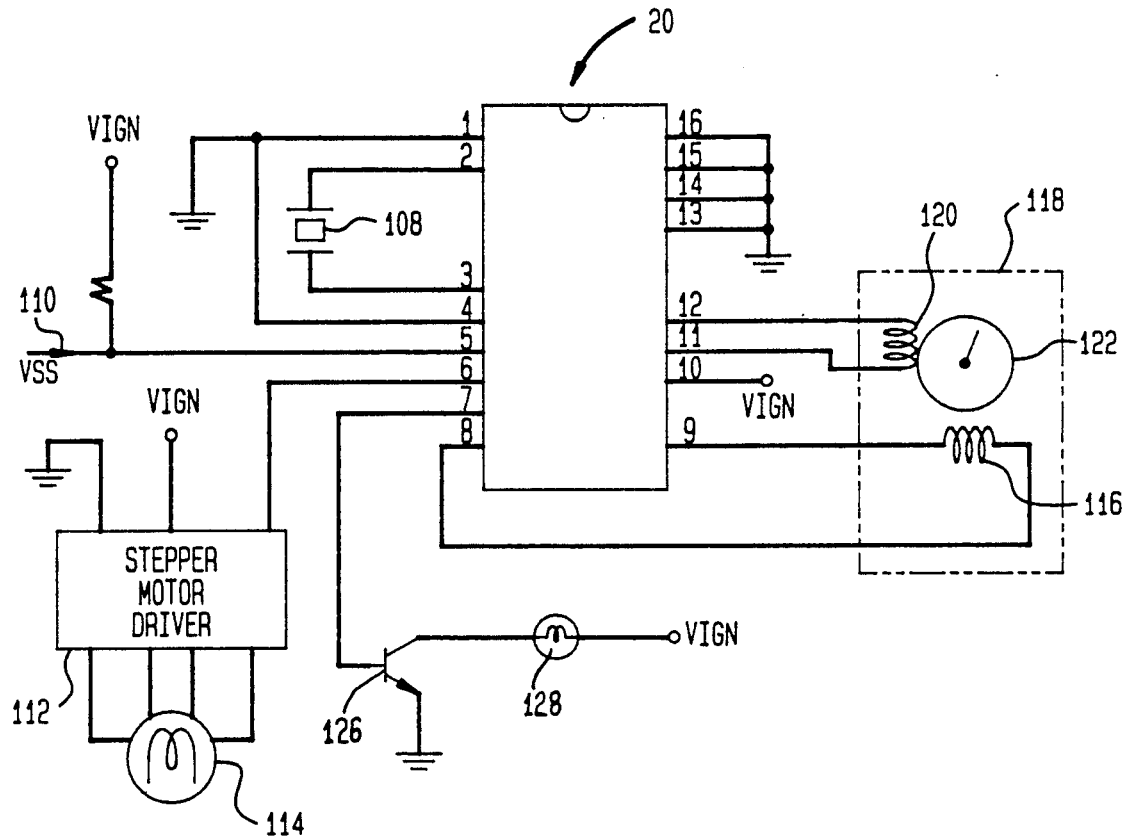
FIG. 4 is a block diagram of a single chip mode pin arrangement for the integrated chip of FIG. 1 for controlling an air, core gage assembly, which is one mode provided for by the present invention illustrated in the block diagram of FIG. 1.
Figure 5:
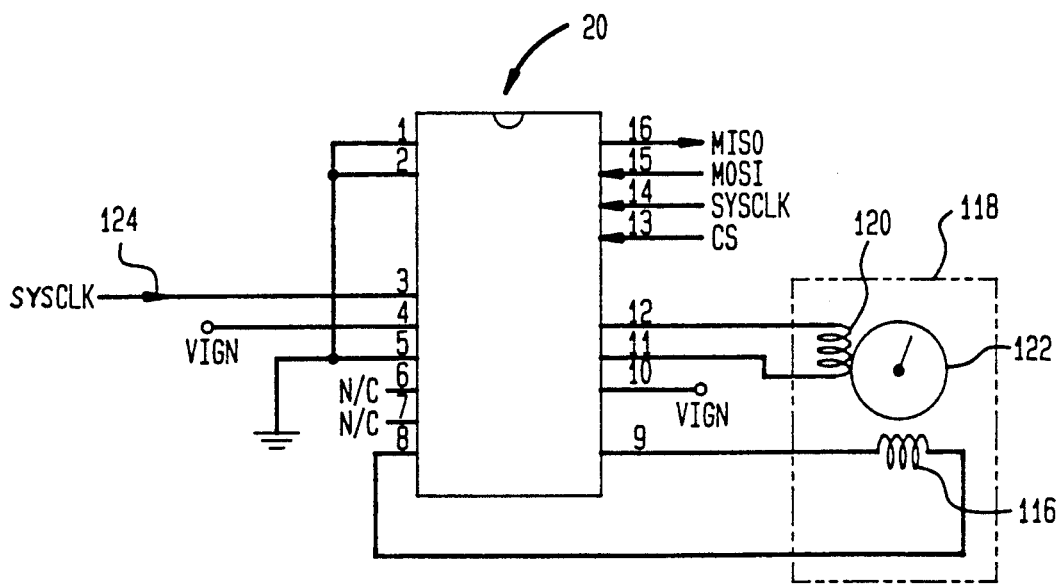
FIG. 5 is a block diagram of a host processor mode pin arrangement for the integrated chip of FIG. 1 for controlling an air core gage assembly, which is a second mode provided for by the present invention illustrated in the circuits of FIGS. 2 and 3.

A control means 24, consisting of the serial engine 22 and a signal conversion circuit 25, is responsive to the data acquisition means 23 and converts the signals acquired by the data acquisition means 23 into drive commands or data to control the air core gage assembly. These commands or data are provided to output means 26 via a serial communication channel 27. The output means 26, which includes drive control circuitry 28 and H-switches 29 and 30, drives the air core gage assembly in response to the commands or data received on the serial communication channel 27. The air core gage assembly is shown in FIGS. 4 and 5.

In FIG. 1, tying pin 4 to ground would result in a single chip mode selection. This would configure the device to receive the vehicle speed signal on pin 5, condition it via wave shape circuitry or other data acquisition means 23, and output it on pin 6. The data acquisition means 23 typically accepts a sinusoidal signal and outputs a square wave signal. The serial circuit 21 provides scaling data from pins 13 through 16 for the serial engine 22. The serial engine 22 would operate normally, per the mode selected on pin 4, with the signal conversion circuit 25 calculating an angular displacement value which would be proportional to the vehicle speed. This value is used by the signal conversion circuit 25 to address a translation table which provides control values for converting the digital vehicle speed value into a series of pulse-width-modulation signals. These PWM signals are provided to the output means 26 via the serial communication channel 27. The output means 26 typically includes H-switch configured transistor arrays 29 and 30 which produce an angular deflection relating to the vehicle speed, where the H-switches 29 and 30 are located on pins 8, 9, 11 and 12. The speed switch output on pin 7 is available in the single chip mode for Over Speed indication at circuit 31, which results when a predetermined input frequency limit is exceeded. A typical application of the single chip mode is illustrated in FIG. 4, which will be described shortly.

The present invention provides an opportunity to effect added functionality in an existing multiple chip implementation by providing serial interface compatibility, thereby creating dual mode applications, wherein the second mode is a host dependent mode. A host dependent mode is preferred for multiple air core gage applications such as where an SPI bus or local serial bus might have multiple chips, with each chip driving a different air core gage assembly. In a host dependent mode, a host is needed to determine the desired angular displacement value at which to operate the air core gage assembly. Any suitable host may be used, including a microprocessor, an engine control module, or a state machine. A state machine, which may be a microcontroller integrated chip or a custom integrated chip, is a logic combination which is capable of performing the functions of a microprocessor in a dedicated application.

Figure 2:
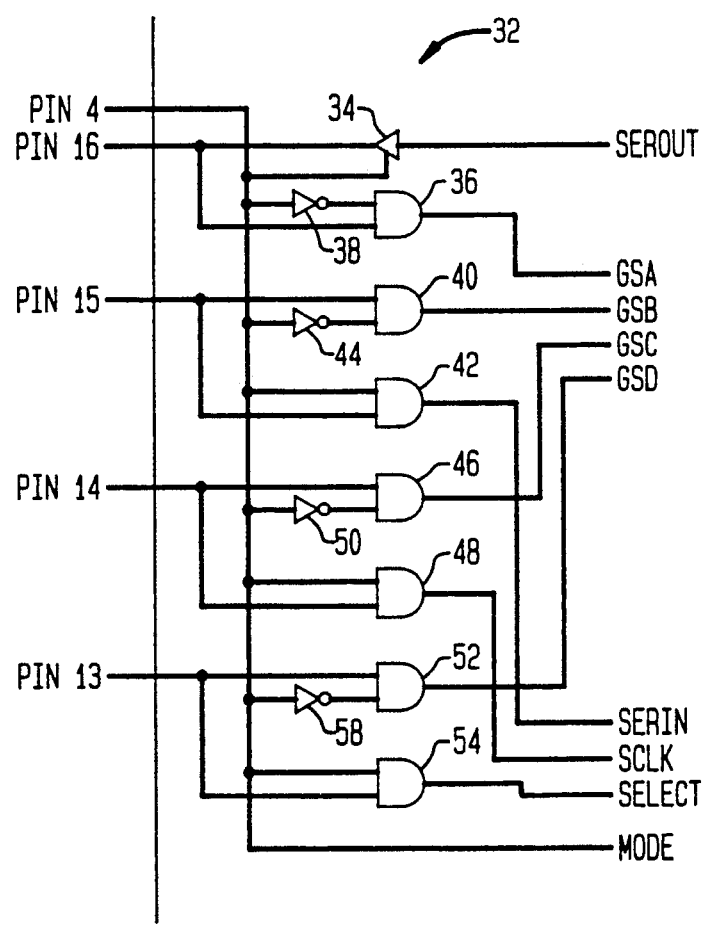
FIG. 2 is a schematic diagram of the logic for multiplexing the gain select and serial peripheral interface lines shown in FIG. 1, in accord with the particular mode of operation.

In FIG. 1, a host dependent mode may be selected by tying pin 4 of IC 20 to a logic high. Such a selection would cause the pins 13 through 16 to be redefined, as best illustrated in FIG. 2. Pin 16 would become a serial output; pin 15 would be redefined as a serial input; pin 14 would become a serial clock; and pin 13 would be a chip select. Redefining pins 13 through 16 in this manner would thereby provide an SPI connection for the selected host, since pins 13 through 16 would be connected to an external microprocessor or other host. The external oscillator input at pin 3 in FIG. 1 would accept an oscillator signal provided by the host's clock signal and the internal crystal frequency circuit would be reconfigured to preserve an internal clock frequency equivalent to the single chip system.

Figure 3:
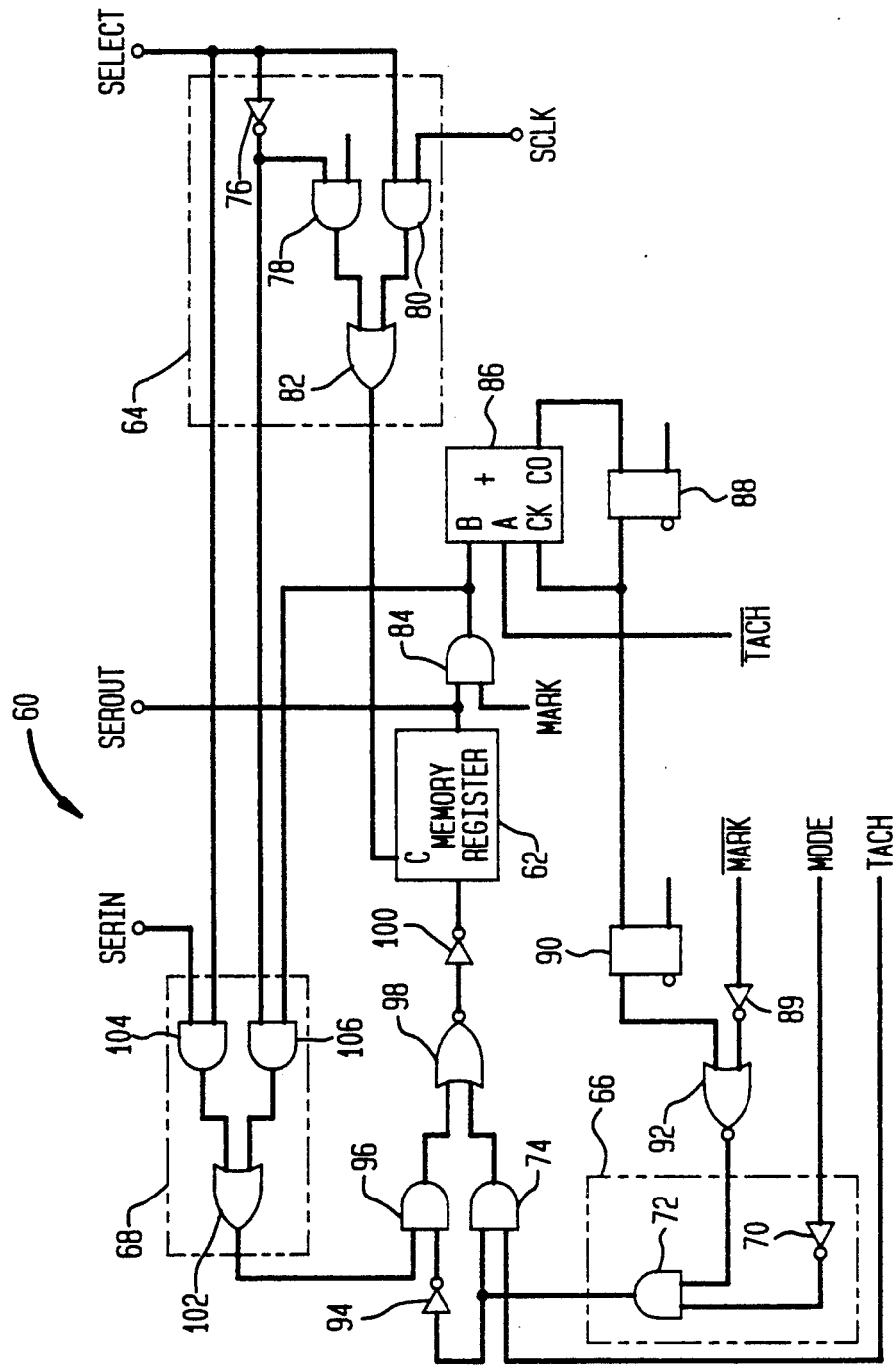
FIG. 3 is a schematic representation of the logic circuitry for a serial engine for gaining serial peripheral interface access in a preferred embodiment of the present invention.

Logic may be added to an existing serial engine to allow access to the memory register 62 of FIG. 3 that normally holds the value calculated by the engine. The added logic that allows access to be gained is included in the serial data input means 21 of FIG. 1 and is best illustrated in the multiplex circuit of FIG. 2 and the boxes 64, 66 and 68 in the circuit of FIG. 3. With access gained, the host is then free to select a chip from the multiple chips, initiate an SPI transaction to transfer a value to the memory register 62, deselect the chip and have the rest of the speedometer logic system drive the H-switches accordingly, as best illustrated in FIG. 5. While in the host dependent mode, the device will provide a vector angle which is linear with respect to the value delivered over the SPI.

Referring now to FIG. 2, the multiplex portion of the serial data input means 21 of FIG. 1 is shown to illustrate how pins 4, 13, 14, 15 and 16 are redefined to provide serial peripheral interface compatibility. In FIG. 2, reference numeral 32 generally refers to the logic for multiplexing the gain select and the host serial interface lines, which consist of lines 13, 14, 15 and 16. The logic diagram of FIG. 3 allows for pre-emption of digital serial engine calculations to provide the multi-purpose, dual mode circuit of the present invention. This pre-emption is best illustrated in FIG. 3, where a MODE signal is input to an invertor 70. When the MODE has a value of one, the output of invertor 70 will necessarily be zero so the output of the AND gate 74 will also necessarily be zero. This effectively aborts the serial engine calculation ability in circuit 25 of FIG. 1, prohibiting the serial content of memory register 62 from being changed, thereby pre-empting the calculations of the signal conversion circuitry 25.

FIG. 2 illustrates the multiplexing of the physical pins 13, 14, 15 and 16 in accord with the mode selected by pin 4. Since not all of the gain selects GSA through GSD and the serial designations, including serial output, serial input and serial clock, may have pin assignments at the same time, the present invention provides for multiplexing. The multiplexing operation carried out in FIG. 2 provides that in the single chip mode, the gain selects (GSA through GSD) are connected to pins 16, 15, 14 and 13, respectively, and in the host dependent mode, the serials (serial out, serial in, serial clock and SELECT) are connected to pins 16, 15, 14 and 13, respectively. A tristate buffer 34 in FIG. 2 allows for a "1" mode wherein the tristate buffer 34 has two normal low impedance 1 and 0 states and a third high impedance state that allows the gain selects and the serials to share bus lines. In FIG. 2, AND gate 36 and invertor 38 multiplex the GSA and the SEROUT signals, depending on the mode. Likewise, AND gates 40 and 42 and invertor 44 multiplex the GSB and the SERIN signals; AND gates 46 and 48 and invertor 50 multiplex the GSC and the SCLK signals; and AND gates 52 and 54 with invertor 58 multiplex the GSD and the SELECT signals. Logic is added to the serial engine, as illustrated by boxes 64, 66 and 68 in FIG. 3, to allow access to the memory register 62 that normally holds the value calculated by the serial engine.

In the host dependent mode, the serial data input circuit 21 of FIG. 1 provides the necessary logic to the serial engine 22 to allow access to the memory register 62 of FIG. 3. With access gained, the host is then free to select any one of the multiple chips in a multiple air core gage application, initiate an SPI transaction to transfer a serial engine calculation value to the memory register 62, deselect the chip, and have the rest of the serial system drive the H-switches 29 and 30 accordingly, as illustrated in FIG. 5. The logic added to the serial data input circuit 21 is illustrated in FIGS. 2 and 3 as the multiplex circuit 32 of FIG. 2 and the serial data interface logic in boxes 64, 66 and 68 of FIG. 3.

The logic diagram of FIG. 3 allows for pre-emption of digital serial engine calculations to provide the multipurpose, dual mode circuit of the present invention. In a host dependent mode, the MODE signal of pin 4 in FIGS. 1 and 2 will have a logic "1" value. Consequently, the output of invertor 70 will be zero and the output of AND gates 72 and 74 will also be zero. This will effectively abort the serial engine calculation ability, prohibiting the serial content of the memory register 62 from being changed, thereby pre-empting the signal conversion circuitry 25 calculations.

The state machine or other host of the host dependent mode initiates a host serial interface through invertor 76, AND gates 78 and 80, and OR gate 82. The SELECT signal of FIG. 2 is input to invertor 76 and AND gate 80. Additionally, the serial clock signal, SCLK, of FIG. 2 also inputs to gate 80. AND gates 78 and 80 provide inputs for OR gate 82 which, in turn, outputs to the memory register 62. Invertor 76 and gates 78, 80 and 82, comprise a portion of the logic added to the serial data input circuit 21 of FIG. 1 to permit host serial interface access in the host dependent mode, which portion is generally referred to as reference number 64. The output of the register 62 connects to the serial output line, SEROUT, of FIG. 2, and to an AND gate 84. The second input to the AND gate 84 is supplied by an input which is designated MARK. The MARK input controls the shifting of data from the register 62 to a serial adder 86 by controlling whether the AND gate 84 will output a logic one or a logic zero to the serial adder 86.

The output of gate 84 is connected to input B of the serial adder 86, where it and a complemented TACH signal are combined to give an output signal amplitude that is proportional to the sum of the input signal amplitudes. A TACH signal is derived from a tachometer algorithm implemented by the circuit of FIG. 3 which may be expressed as $TACH = TACH - (TACH/N) + M$, where N and M are constants. The value of the constants depend on a number of factors including the size of the register 62 and the desired time constant for the circuit. The complemented TACH signal, then, is derived from the finite positional notation of the TACH signal.

The serial adder 86 is operatively associated with flip-flops 88 and 90. A complemented MARK signal, derived from the MARK input, and the TACH signal ultimately supply the inputs for AND gate 74, via invertors 70 and 89 (through which a MODE signal is supplied), NOR gate 92 (one input of which is supplied by flip-flop 90) and AND gate 72. One input to AND gate 74 is tied via an invertor 94 to an input to AND gate 96, the outputs of which together provide the inputs for NOR gate 98 and, ultimately, invertor 100. The second input of AND gate 96 is provided by OR gate 102 and AND gates 104 (which receives one input from the serial input signal, SERIN, of FIG. 2) and 106.

Referring now to FIG. 4, a typical application for a single chip mode, as described in conjunction with FIG. 1, is illustrated by the pin assignments of integrated chip 20. Pins 4 and 1 are connected to ground, thus setting the mode of operation to single chip mode. Pins 2 and 3 are connected to a crystal or resonator, indicated by reference number 108. Pin 7 is connected to the base of transistor 126 for the purpose of controlling the illumination of light bulb 128 during an over speed condition.

The speed switch output, pin 7, is available in the single chip mode for Over Speed indication, as detected by the Over Speed circuit 31 of FIG. 1.

In a typical application of a single chip mode, the gain selects A, B, C and D receive pin assignments 16, 15, 14 and 13, respectively. The single chip mode may be selected by maintaining a fixed gain value, such as by tying pin 4 in FIG. 1 to ground. This provides the necessary static inputs to permit the gain, or the angle of displacement for a given input, to be calculated in the single chip mode. With the gain fixed, the device would then be configured to take the vehicle speed signal, VSS, in on pin 5, condition it and output it on pin 6, with the external connection 110 connecting pin 5 to a vehicle speed sender (not shown).

A stepper motor driver 112 resolves the vehicle speed signal output at pin 6 into controls which rotate a motor 114 at a rate proportional to a distance traveled by the vehicle. The stepper motor driver 112 controls the motor that turns the wheels in a mechanical odometer.

The speedometer logic serial engine would operate normally, per the gain select programmed on pins 13, 14, 15 and 16, calculating a serial engine desired angular displacement value held in memory register 62 of FIG. 3 which would be proportional to the vehicle speed. This value may then be used to address a translation table which provides control values for converting the digital vehicle speed value into a series of pulse-width-modulation signals. As shown in FIG. 1, these PWM signals control the drive circuitry, which is typically comprised of H-switch configured transistor arrays. The H-switch outputs are located on pins 8, 9, 11 and 12. Pins 8 and 9 are connected to an air core gage coil 116, which is part of a typical air core gage assembly 118, in which the coil 116 is a horizontal coil and a coil 120 is a vertical coil. Current flowing through each of these coils 116 and 118 causes a magnetic flux field to be induced. As the current varies, the induced flux field varies. The varying flux field causes a magnet and spindle vehicle speed indicator assembly 122 to rotate. By controlling the magnitude and direction of the current through each coil, a flux field can be established to control the resultant angle of rotation of the assembly 122 to produce an accurate vehicle speed reading.

Referring now to FIG. 5, a typical host dependent mode for driving an air core gage assembly may be selected by tying pin 4 of the integrated chip 20 to the vehicle ignition voltage, VIGN. Such a selection would cause the gain select pins 13 through 16 to be redefined, as illustrated in FIG. 2 and described in conjunction therewith. Pin 16 would become a serial output; pin 15 would be redefined as a serial input; pin 14 would become a serial clock; and pin 13 would be a chip select. Redefining pins 13 through 16 in this manner would provide a host interface connecting serial lines 13, 14, 15 and 16 to a microprocessor or other host via the chip select (CS) line, the clock (CLK) line, the master-out-slave-in line (MOSI) and the master-in-slave-out (MISO) line, respectively, as illustrated in FIG. 5. With this configuration, the host calculates the angular displacement value.

In FIG. 5, the input at pin 3 in FIG. 1 would accept an oscillator signal, SYSCLK or system clock, provided by the host's clock signal, where the SYSCLK signal is also from the host. Pins 8, 9, 11 and 12 are connected to a typical air core gage assembly 118. In a host processor mode, the TACH input signal to AND gate 74 in FIG. 3 is blocked from reaching NOR gate 98, thereby preventing normal serial digital tachometer engine calculations. Hence, the serial content of the memory register 62 cannot be changed by the serial engine 22. Therefore, the microprocessor or other host calculates the angular displacement value and places it in the memory register 62 via the host interface.

In addition to the various modifications described above, further modifications will occur to those skilled in the art, and it should be understood that air core gage controllers incorporating such modifications may fall within the scope of this invention, which is defined in the appended claims.

The embodiments of the invention in which an exclusive property or privilege is claimed are defined as follows:

1. A serial interface circuit for driving an air core gage assembly, the circuit being capable of operating in a single chip mode or a host dependent mode, comprising:

mode select means for selecting the single chip mode or the host dependent mode;

data acquisition means for acquiring signals pertaining to a parameter to be displayed;

control means including serial engine means for computing a gage displacement value based on the signals acquired by said data acquisition means and a memory register for storing a gage displacement command;

serial circuit means effective when the single chip mode is selected to store the computed gage displacement value in said memory register, and when said host dependent mode is selected to store a remotely generated displacement value in said memory register;

signal conversion means for converting the gage displacement command stored in said memory register to air core gage assembly drive commands wherein the commands are provided on a serial communication channel; and output means for driving the air core gage assembly in response to the commands received on the serial communication channel.

2. A serial interface circuit as claimed in claim 1 wherein the remotely generated displacement value is provided by an engine control module of a vehicle via a vehicle serial bus.

3. A serial interface circuit as claimed in claim 1 wherein the remotely generated displacement value is provided by a host processor via a local serial bus.

* * * * *